United States Patent [19]
Kasahara

[11] Patent Number: 5,394,423
[45] Date of Patent: Feb. 28, 1995

[54] SURFACE EMITTING SEMICONDUCTOR LASER

[75] Inventor: Kenichi Kasahara, Tokyo, Japan
[73] Assignee: NEC Corporation, Tokyo, Japan
[21] Appl. No.: 186,649
[22] Filed: Jan. 26, 1994
[30] Foreign Application Priority Data
  Jan. 26, 1993 [JP] Japan .................. 5-10577
[51] Int. Cl.[6] .............................................. H01S 3/19
[52] U.S. Cl. ...................................... 372/45; 372/46; 372/49
[58] Field of Search .......................... 372/45, 46, 49

[56] References Cited

FOREIGN PATENT DOCUMENTS 0125990  9/1979  Japan ............................ 372/46
0250380 10/1990  Japan ............................ 372/46

OTHER PUBLICATIONS

Extended Abstracts (The 39th Spring Meeting, 1992); The Japan Society of Applied Physics and Related Societies, No. 3, 1992 Mar. 28–31.
Tsukada et al., "Very Low Current Operation of Mesa Stripe Geometry Double Heterostructure Injection Laser," Appl. Phys Lett., vol. 29, No. 9, 1 May 1972, pp. 344–345.

Primary Examiner—Georgia Y. Epps
Attorney, Agent, or Firm—Sughrue, Mion, Zinn, Macpeak & Seas

[57] ABSTRACT

A first insulation film is provided on the x axis side surfaces of a mesa on a substrate of a surface emitting semiconductor laser, and a second insulation film is provided on the y axis side surfaces of the mesa. The x and y axes are orthogonal to each other. The first and second insulation films are formed at different temperatures, so that stress applied to an active layer is different between the x and y axis directions. Consequently, the polarization of an output light is controlled to be on a selected axis from the x and y axis directions.

4 Claims, 5 Drawing Sheets

- 31 GaAs SUBSTRATE
- 32 $Al_{0.3}Ga_{0.7}As$
- 33 GaAs ACTIVE LAYER
- 34 $Al_{0.3}Ga_{0.7}As$
- 35 ELLIPTICAL LIGHT EMISSION APERTURE

- 192 SiN FILM
- 17 CATHODE
- 191 SiN FILM

SURFACE EMITTING SEMICONDUCTOR LASER

FIELD OF THE INVENTION

This invention relates to a surface emitting semiconductor laser, and more particularly to, a semiconductor laser for emitting an output light of a well controlled polarization plane in a constant direction.

BACKGROUND OF THE INVENTION

A surface emitting semiconductor laser has been researched and developed for a light source which is possible to be small in size and two-dimensionally integrated by domestic and foreign research institutes. One of problems to be solved in the surface emitting semiconductor laser is to stabilize the polarization direction of an output light. In a surface emitting semiconductor laser having an isotropic configuration, the difference of properties on two axes orthogonal to each other is not observed, so that output lights are polarized on the two axes by the same provability. This means that the polarization is not fixed in one direction. If the polarization is not stabilized in one direction, optical devices such as a polarization beam splitter having polarization dependency can not be used in optical systems such as an optical interconnection system, an optical switching system, an optical information processing system, etc.

In order to overcome such a problem, a conventional surface emitting semiconductor laser comprising an $Al_{0.3}Ga_{0.7}As$ layer, a GaAs active layer and an $Al_{0.3}Ga_{0.7}As$ layer successively grown on a GaAs substrate having an elliptical light emission aperture has been proposed as described in No. 3 in the Extended Abstracts (the 39th Spring Meeting, 1992), the Japan Society of Applied Physics and Related Societies".

In fabrication of the surface emitting semiconductor laser, the GaAs substrate having a thickness of, for instance, 100 μm is etched to be provided with the elliptical light emission aperture.

In accordance with the provision of the elliptical light emission aperture, stress is applied to the GaAs active layer, such that the tensile stress is smaller in the long axis direction for the elliptical light emission aperture. Consequently, an output light is stabilized in polarization to be positioned on the long axis.

In the conventional surface emitting semiconductor laser, however, there is disadvantage in that the fabrication thereof is difficult, and the reliability thereof is low, because the etched light emission aperture is required to stop in the $Al_{0.3}Ga_{0.7}As$ layer immediately below the GaAs active layer, and the $Al_{0.3}Ga_{0.7}As$ layer is occasionally made thin.

SUMMARY OF THE INVENTION

Accordingly, it is an object of the invention to provide a surface emitting semiconductor laser which is fabricated without a difficult fabrication step.

It is a further object of the invention to provide a surface emitting semiconductor laser which is high in reliability.

According to the invention, a surface emitting semiconductor laser, comprises:

a mesa structure provided on a semiconductor substrate, the mesa structure comprising a first cladding layer of a first conductivity type, an active layer of the first conductivity type, and a second cladding layer of a second conductivity type;

means for applying an electric field across the mesa to emit an output light in a direction orthogonal to the semiconductor substrate;

a first insulation film provided on x axis side surfaces of the mesa, the first insulation film being formed at a first temperature; and a second insulation film provided on y axis side surfaces of the mesa, the y axis being orthogonal to the x axis, and the second insulation film being formed at a second temperature different from the first temperature.

BRIEF DESCRIPTION OF THE DRAWINGS

The invention will be explained in more detailed in conjunction with appended drawings, wherein.

DESCRIPTION OF THE PREFERRED EMBODIMENTS

Before explaining a surface emitting semiconductor laser in the first preferred embodiment according to the invention, a conventional surface emitting semiconductor laser which has been proposed to set the polarization of an output light in a predetermined direction will be explained in FIG. 1.

Figure 1:
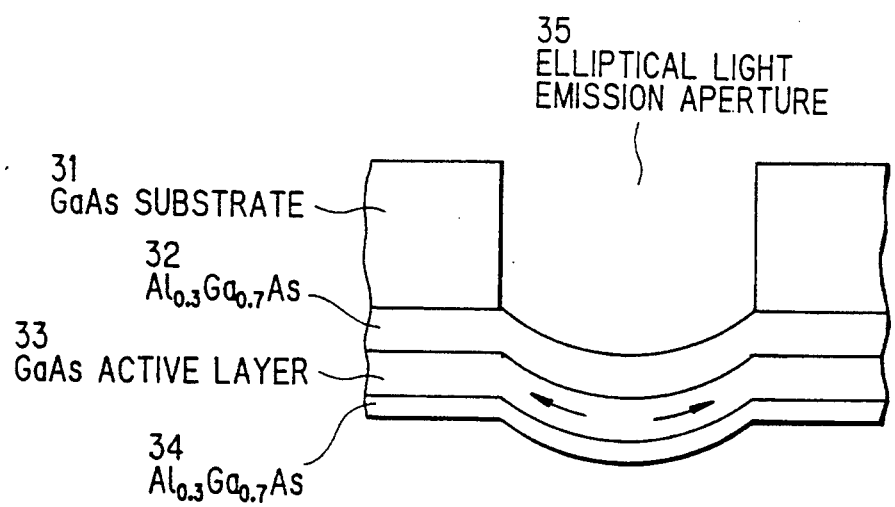
FIG. 1 is a cross-sectional view showing a conventional surface emitting semiconductor laser.

FIG. 1 shows the surface emitting semiconductor laser of GaAs/AlGaAs system which comprises an $Al_{0.3}Ga_{0.7}As$ layer 32, a GaAs active layer 33, and an $Al_{0.3}Ga_{0.7}As$ layer 34 successively grown on a GaAs substrate 31, wherein an elliptical light emission aperture 35 is provided through the GaAs substrate 31 by etching, so that stress is applied to the active layer 33.

In the conventional surface emitting semiconductor laser, the tensile stress is smaller in the long axis direction of the light emission aperture 35 than in the short axis direction thereof, so that the polarization plane of an emission light is on the long axis of the light emission aperture 35.

Figure 2:
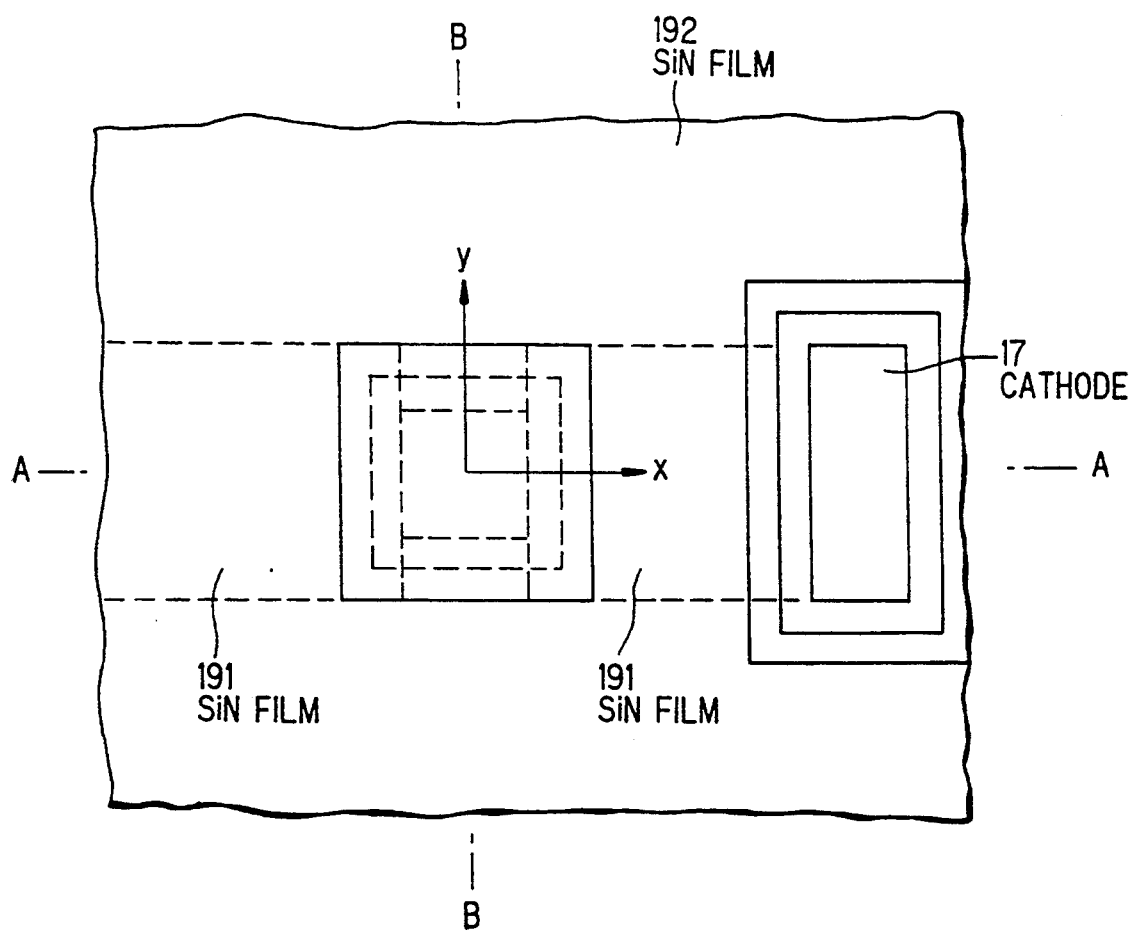
FIG. 2 is a plan view showing a surface emitting semiconductor laser in a first preferred embodiment according to the invention.
Figure 3:
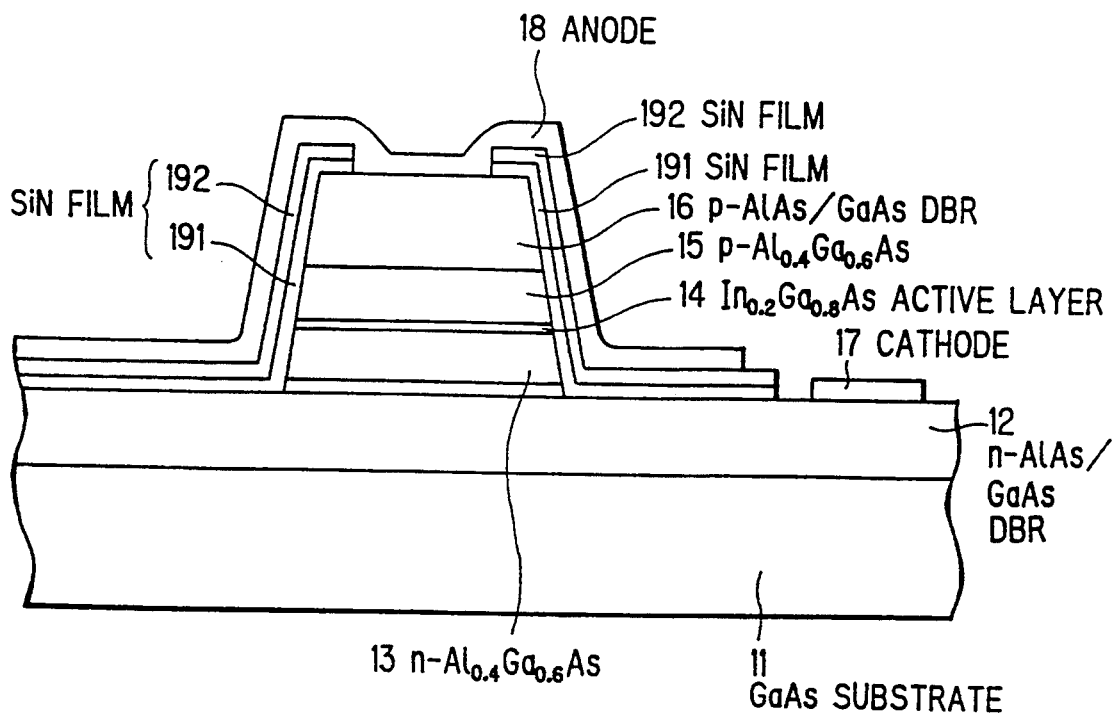
FIG. 3 is a cross-sectional view taken along A—A in FIG. 2.
Figure 4:
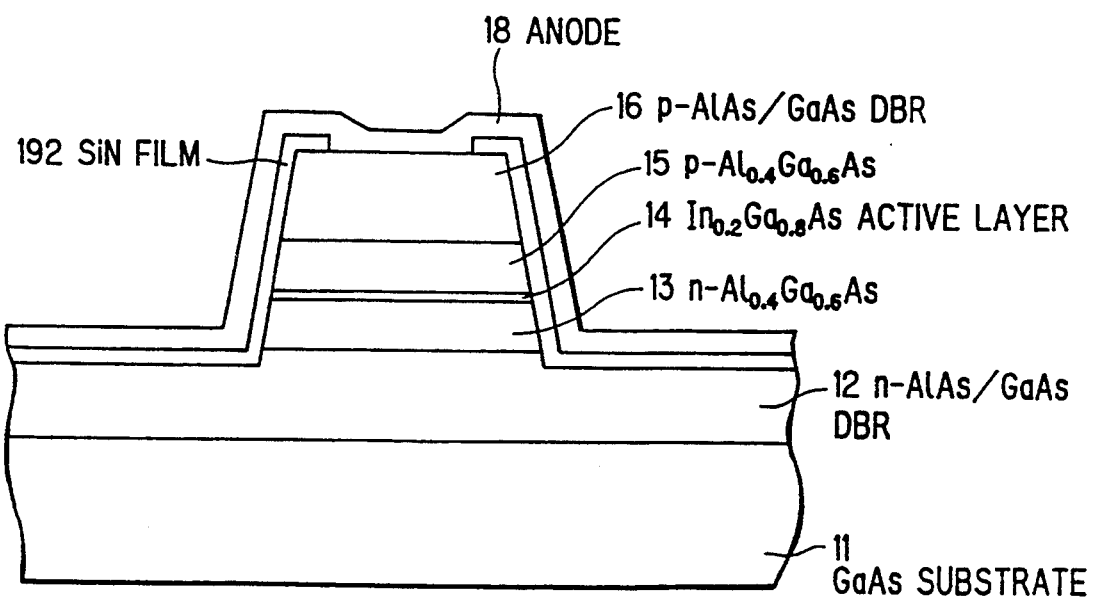
FIG. 4 is a cross-sectional view taken along B—B in FIG. 2.

Next, a surface emitting semiconductor laser in the first preferred embodiment according to the invention will be explained in FIGS. 2 to 4.

The surface emitting semiconductor laser comprises a n-GaAs substrate 11, a n-AlAs/GaAs Distributed Bragg Reflection mirror (DBR) 12, a n-$Al_{0.4}Ga_{0.6}As$ cladding layer 13, an $In_{0.2}Ga_{0.8}As$ active layer 14 having a thickness of 100 Å and a lasing wavelength of 9800 Å, a p-$Al_{0.4}Ga_{0.6}As$ cladding layer 15, a p-AlAs/GaAs DBR 16, a cathode electrode of AuGe-Ni/Au, an anode electrode 18 of CrAu, and SiN films 191 and 192.

In the surface emitting semiconductor laser, the total thickness of the n-$Al_{0.4}Ga_{0.6}As$ cladding layer 13, the In$_{0.2}$Ga$_{0.8}$As active layer 14, and the p-Al$_{0.4}$Ga$_{0.6}$As cladding layer 15 is half a wavelength in the medium, and the periodical numbers of the n- and p-AlAs/GaAs DBRs 12 an 16 are 24.5 pairs and 15 pairs, respectively.

In fabrication, the growth is carried out by using MBE (molecular rays beam epitaxy), and dopants of p- and n-types are BE and Si, respectively. The surface emitting semiconductor laser is mesa-etched to have a configuration of 10 $\mu \times m \times 10 \mu m$ (square).

The formation of the SiN films 191 and 192 is carried out as explained below by using x axis parallel to the line A—A and y axis parallel to the line B—B in FIG. 2, wherein the x and y axes are orthogonal to each other.

On the both side surfaces of the mesa in the x axis direction, the SiN film 191 is deposited by a thickeners of 1500 Å under the state where the wafer is heated at a temperature of 300° C. At this step, p-CVD method is used to provide the deposition of the SiN film 191 on the whole surface of the wafer. Then, the SiN film 191 is etched to exist only on the left and right side surfaces of the mesa and the left and right surfaces of the n-AlAs/GaAs DBR 12 subsequent to the mesa side surfaces. Then, the SiN film 192 is deposited by a thickness of 1500 Å under the state where the wafer is heated at a temperature of 100° C. Then, a square aperture is opened on the top of the mesa to connect the anode electrode 18 to the p-AlAs/GaAs layer 16. Thus, the SiN films 191 and 192 are provided on the side surfaces of the mesa in the x axis direction, while the SiN film 192 is only provided on the side surfaces of the mesa in the y axis direction. The SiN films 191 an 192 function as not only insulating films to prevent the anode electrode 18 from being connected to the n-side semiconductor, but also members to apply different stresses to the active layer 14 in the x and y axes directions. Consequently, an anisotropic property occurs in the lasing threshold gain of the surface emitting semiconductor laser, so that a mode in the axis direction having a smaller threshold gain is only obtained.

In fabrication of the surface emitting semiconductor laser, the SiN film 191 is deposited on the x axis-side surfaces of the mesa at the heated temperature of 300° C. which is higher than that for the y axis-side surfaces thereof, wherein the thermal expansion coefficient of SiN is less than or equal to $2.5 \times 10^{-6} K^{-1}$, and that of GaAs system semiconductor is less than or equal to $5 \times 10^{-6} K^{-1}$. As a result, a larger tensile strength is applied to the active layer 14 in the x axis direction than in the y axis direction, when the surface emitting semiconductor laser is restored to the room temperature. Consequently, the polarization of the output light is on the y axis of a smaller tensile stress.

Figure 5:
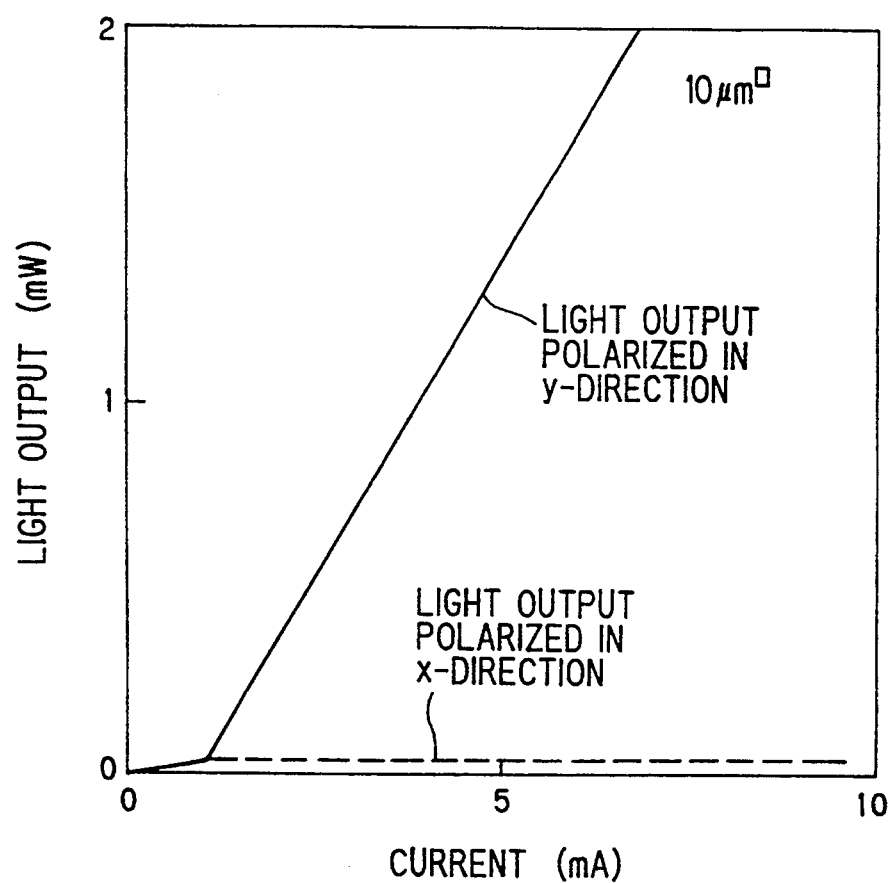
FIG. 5 is a diagram showing the dependency of an optical output light to a current on the direction of polarization.

FIG. 5 shows light outputs having polarization in the x and y axes directions. As apparent from the illustration, the lasing threshold current is as low as 1 mA, and the polarization is well controlled.

Figure 6:
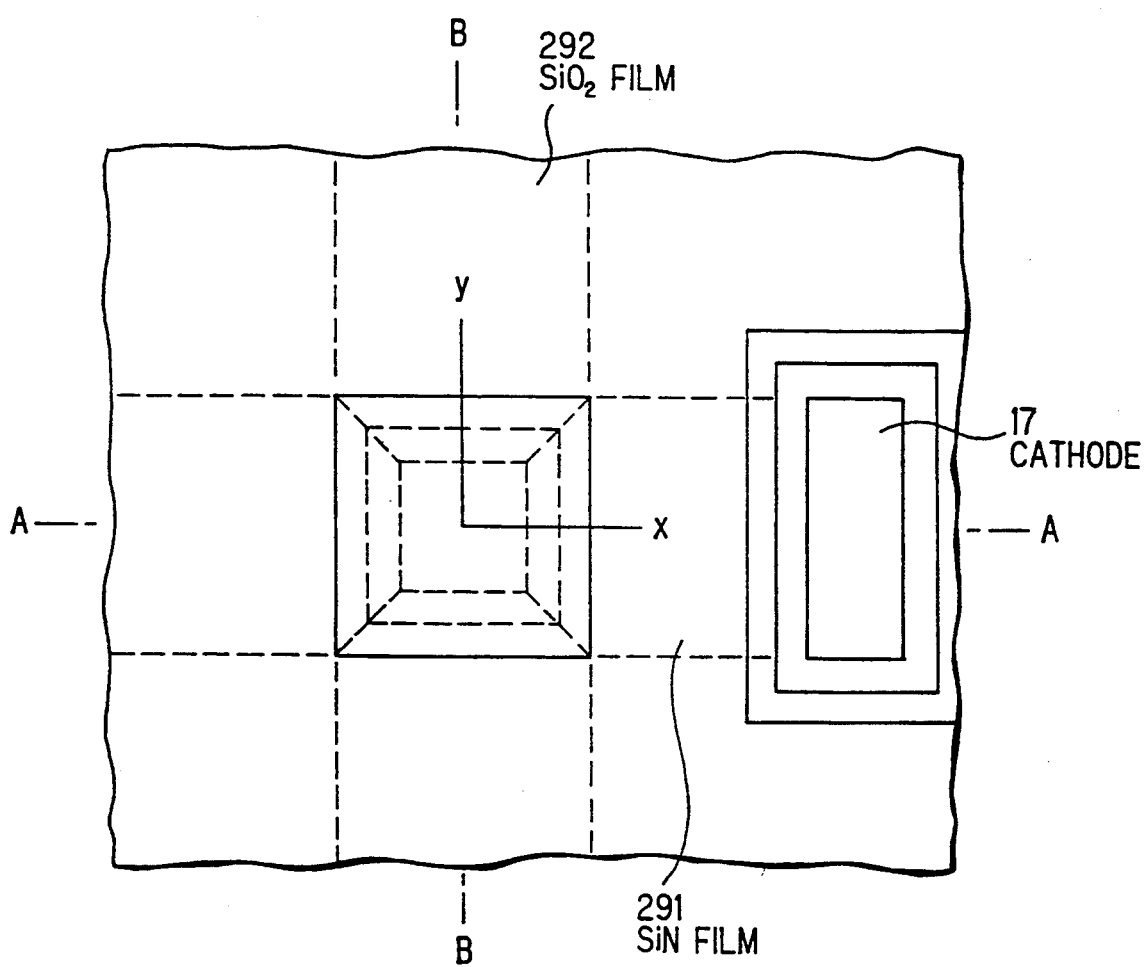
FIG. 6 is a plan view showing a surface in a second preferred embodiment according to the invention.
Figure 7:
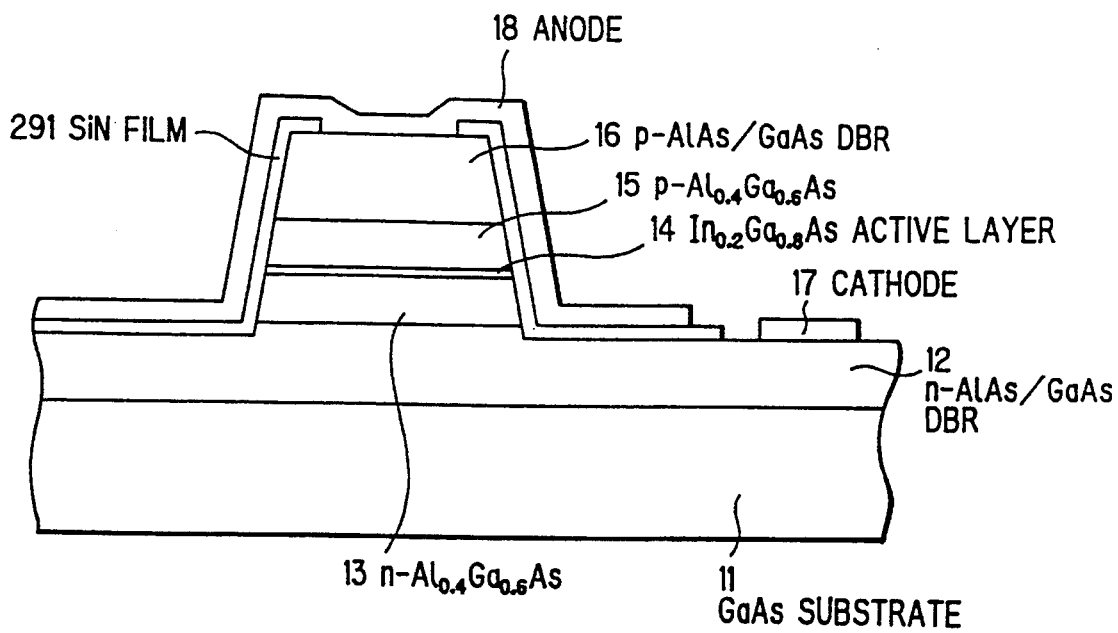
FIG. 7 is a cross-sectional view taken along A—A in FIG. 6
Figure 8:
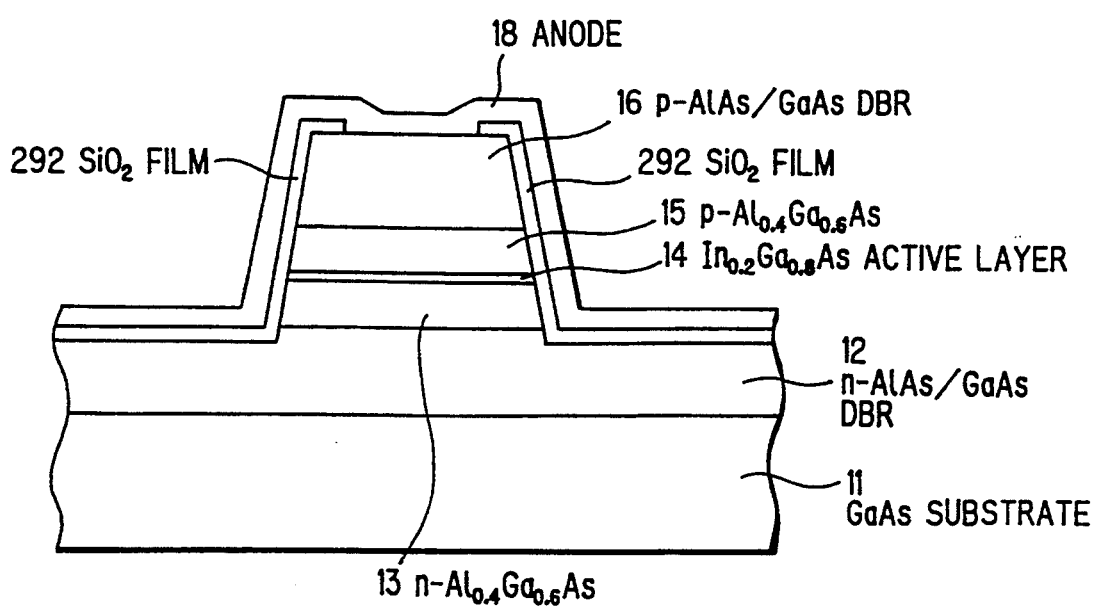
FIG. 8 is a cross-sectional view taken along B—B in FIG. 6.

FIG. 6 to 8 show a surface emitting semiconductor laser in the second preferred embodiment according to the invention, wherein like parts are indicated by like reference numerals.

The difference of the second preferred embodiment from the first preferred embodiment is that a SiN film 291 having the composition of 3:4 between Si and N is deposited at 300° C., and a SiO$_2$ film 292 deposited in the y axis direction at 100° C. In the second preferred embodiment, the design of stress applied to the active layer 14 is easier than the first preferred embodiment.

In the deposition of the SiN and SiO$_2$ films 291 and 292, the SiN film 291 is first deposited on the whole surface of the wafer by p-CVD method, and the deposited SiN film 291 is dry-etched to be left only in the x axis direction. Then, the SiO$_2$ film 292 is deposited on the whole surface, and the deposited SiO$_2$ film 292 is wet-etched to be left only in the y axis direction by using buffered HF. The SiN film 291 having the composition of 3:4 is not wet-etched by buffered HF, so that the formerly deposited SiN film 291 is remained in the x axis direction, even after the wet-etching, even after the wet-etching of the SiO$_2$ film 292.

In the second preferred embodiment, the same polarization property as shown in FIG. 5 is obtained.

In the first and second preferred embodiments, a surface emission semiconductor laser is fabricated by GaAs/AlGaAs system semiconductor. However, other semiconductor materials such as InP/InGaAS may be used.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A surface emitting semiconductor laser, comprising:
   a mesa structure provided on a semiconductor substrate, said mesa structure comprising a first cladding layer of a first conductivity type, an active layer of said first conductivity type, and a second cladding layer of a second conductivity type;
   means for applying an electric field across said mesa to emit an output light in a direction orthogonal to said semiconductor substrate;
   a first insulation film provided on x axis side surfaces of said mesa, said first insulation film being formed at a first temperature; and
   a second insulation film provided on y axis side surfaces of said mesa, said y axis being orthogonal to said x axis, and said second insulation film being formed at a second temperature different from said first temperature.

2. A surface emitting semiconductor laser, according to claim 1, wherein:
   said first and second insulation films are SiN films.

3. A surface emitting semiconductor laser, according to claim 1, wherein:
   said first insulation film is a SiN film, and said second insulation film is a SiO$_2$ film.

4. A surface emitting semiconductor laser, according to claim 1, wherein:
   said first temperature is higher than said second temperature.

* * * * *